United States Patent
Mizuno

(10) Patent No.: US 8,575,827 B2
(45) Date of Patent: Nov. 5, 2013

(54) DISPLAY APPARATUS

(75) Inventor: Nobutaka Mizuno, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/488,198

(22) Filed: Jun. 4, 2012

(65) Prior Publication Data

US 2012/0313501 A1 Dec. 13, 2012

(30) Foreign Application Priority Data

Jun. 7, 2011 (JP) ................................. 2011-127679
Apr. 17, 2012 (JP) ................................. 2012-094072

(51) Int. Cl.
*H05B 33/12* (2006.01)

(52) U.S. Cl.
USPC ............................ 313/110; 313/112; 313/504

(58) Field of Classification Search
None
See application file for complete search history.

(56) References Cited

U.S. PATENT DOCUMENTS

| 2008/0067926 A1* | 3/2008 | Mizuno et al. | 313/504 |
| 2008/0136322 A1* | 6/2008 | Kurotaki et al. | 313/504 |
| 2008/0157663 A1* | 7/2008 | Sung et al. | 313/504 |
| 2009/0121620 A1* | 5/2009 | Satoh et al. | 313/504 |

FOREIGN PATENT DOCUMENTS

| JP | 2003-109775 A | 4/2003 |
| JP | 2004-039500 A | 2/2004 |

\* cited by examiner

*Primary Examiner* — Ashok Patel
(74) *Attorney, Agent, or Firm* — Canon U.S.A., Inc., IP Division

(57) ABSTRACT

A display apparatus has an organic EL element which emits red color, an organic EL element which emits green color, and an organic EL element which emits blue color, in which a structure for improving light emission efficiency is provided only at the light emission side of the organic EL element which emits blue color.

12 Claims, 3 Drawing Sheets

DISPLAY APPARATUS

BACKGROUND OF THE INVENTION

1. Field of the Invention

The present invention relates to a display apparatus employing an organic EL element.

2. Description of the Related Art

The organic EL element is constituted by laminating a first electrode disposed at a substrate side, an organic compound layer containing a light emitting layer, and a second electrode. Mentioned as the goal to be achieved of the display apparatus employing the organic EL element is a reduction in power consumption, and an improvement of the light emission efficiency of the organic EL element has been demanded.

To achieve the goal, Japanese Patent Laid-Open No. 2003-109775 describes an attempt of improving the current efficiency by introducing a resonator structure in which metals are used for both the first electrode and the second electrode. Moreover, in Japanese Patent Laid-Open No. 2004-039500, by disposing a lens at the light emission sides of all of the organic EL elements, light confined in the organic EL elements is extracted into the air and is condensed to the front to thereby improve the current efficiency.

In general, the reflectance of a metal thin film becomes small in a short wavelength of a visible light region as illustrated in FIG. 2. Therefore, when a metal thin film is used as an electrode at the light emission side in a display apparatus having organic EL elements which emit blue color, green color, and red color, the resonance effect of the organic EL element which emits blue color becomes smaller than that of the organic EL elements which emit other colors. As a result, when introducing the resonator structure as in Japanese Patent Laid-Open No. 2003-109775, the current efficiency of the organic EL element which emits blue color becomes more difficult to improve than the organic EL elements which emit other colors. Therefore, there is a problem in that the power consumption of the entire display apparatus does not decrease.

When a lens is provided as in Japanese Patent Laid-Open No. 2004-039500, there is a problem in that external light is scattered on the lens surface and oblique incident light is reflected to the front by the lens, so that the contrast decreases.

SUMMARY OF THE INVENTION

The present invention provides a display apparatus with low power consumption and high contrast.

The present invention is a display apparatus having an organic EL element which emits red color, an organic EL element which emits green color, and an organic EL element which emits blue color, in which a structure for improving light emission efficiency is provided only at the light emission side of the organic EL element which emits blue color.

The present invention is also a display apparatus having an organic EL element which emits fluorescent light and an organic EL element which emits phosphorescent light, in which a structure for improving light emission efficiency is provided only at the light emission side of the organic EL element which emits fluorescent light.

Further features of the present invention will become apparent from the following description of exemplary embodiments with reference to the attached drawings.

DESCRIPTION OF THE EMBODIMENTS

Hereinafter, an embodiment of the display apparatus according to the invention is described with reference to the drawings. To portions which are not illustrated or described in this description, well-known or known techniques of the related technical field are applied. The embodiment described below is one embodiment of the invention and the invention is not limited thereto.

Figure 1A:
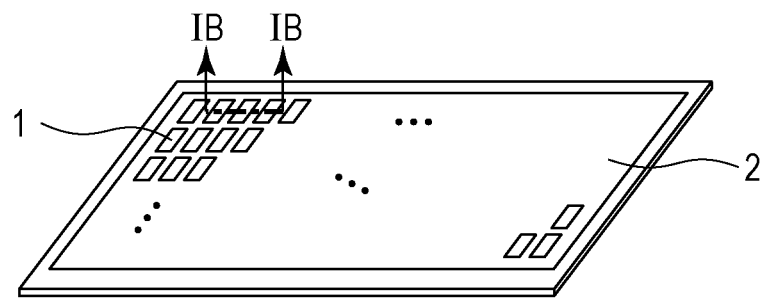
FIGS. 1A and 1B are a perspective schematic view and a cross-sectional schematic view, respectively, illustrating an example of the display apparatus according to the invention.

FIG. 1A is a perspective schematic view illustrating the display apparatus according to the embodiment of the invention. The display apparatus of this embodiment has a plurality of pixels 1 having an organic EL element. The plurality of pixels 1 are disposed in the shape of a matrix to form a display region 2. The pixel means a region corresponding to the light emitting region of one light emitting element. The display apparatus of this embodiment is a display apparatus in which the light emitting element is the organic EL element and the organic EL element of one color is disposed at each of the pixels 1. Mentioned as the luminescent colors of the organic EL elements are red color, green color, and blue color and, in addition thereto, yellow color and cyan color may be acceptable. Moreover, in the display apparatus of this embodiment, a plurality of pixel units containing a plurality of pixels (e.g., a pixel which emits red color, a pixel which emits green color, and a pixel which emits blue color) different in the luminescent color are arranged. The pixel unit represents the minimum unit capable of emitting a desired color by mixing colors of the pixels.

Figure 1B:
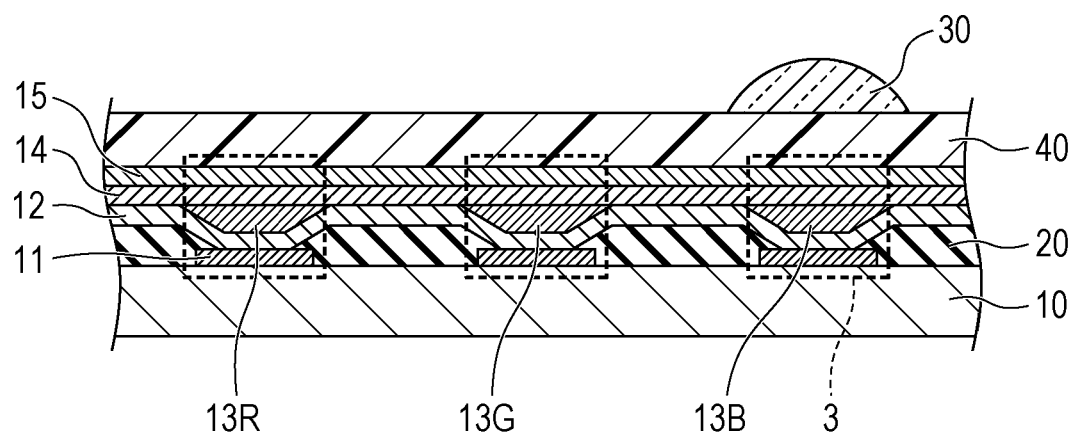

FIG. 1B is a partial cross-sectional schematic view along the IB-IB line of FIG. 1A. One pixel has an organic EL element 3 having a first electrode (anode) 11, a hole transporting layer 12, any one of light emitting layers 13R, 13G, and 13B, an electron transporting layer 14, and a second electrode (cathode) 15 on a substrate 10. The organic EL element 3 of the invention has a configuration such that a reflection plane which reflects light emitted from the light emitting layer to the first electrode 11 is provided on the first electrode 11, so that the light is extracted from the second electrode 15. The light emitting layer 13R is a light emitting layer which emits red color, the light emitting layer 13G is a light emitting layer which emits green color, and the light emitting layer 13B is a light emitting layer which emits blue color. The light emitting layers 13R, 13G, and 13B are pattern formed corresponding to the pixels (organic EL element 3) which emit red color, green color, and blue color, respectively. The first electrodes 11 are also formed in such a manner that the first electrodes 11 of the adjacent pixels (organic EL elements 3) are isolated from each other. The hole transporting layer 12, the electron transporting layer 14, and the second electrode 15 may be formed in common with those of the adjacent pixel or may be pattern formed every pixel. In order to prevent short-circuiting of the first electrode 11 and the second electrode 15 due to a foreign substance, an insulating layer 20 is provided between the pixels (more specifically the first electrodes 11).

The power consumption of the display apparatus when causing the organic EL elements which emit red color, green color, and blue color to emit light, and then mixing the colors to display white color in the front side is affected by the influence of the front current efficiency of the organic EL elements. In order to lower the power consumption, it is desirable to increase the current efficiency [cd/A] of the organic EL elements.

As a method for increasing the current efficiency, it has been devised to provide a structure of a two-dimensional shape or three-dimensional shape for improving light emission efficiency, such as a diffraction grating or a lens, at the light extraction side of the organic EL element. However, when such a structure is provided, there is a problem in that external light is scattered on the structure surface or oblique incident light is diffracted, scattered, and refracted to be a reflected light in the front direction, so that the contrast decreases.

More specifically, it is desirable to provide the above-described structure for reducing the power consumption, but providing the above-described structure causes a reduction in contrast.

The invention aims at reducing the power consumption when displaying white color without deteriorating the contrast which is an important goal to be achieved in the display apparatus. Specifically, the display apparatus of this embodiment employs a configuration such that the structure for improving light emission efficiency is provided only at the light emission side of the organic EL element with the biggest current efficiency among the plurality of organic EL elements which emit different colors. In FIG. 1B, the organic EL element with the biggest current efficiency is the organic EL element which emits blue color and the structure for improving light emission efficiency is a lens 30. In FIG. 1B, a protective layer 40 which protects the organic EL element 3 from moisture or oxygen is disposed between the lens 30 and each of the organic EL elements 3.

Figure 2:
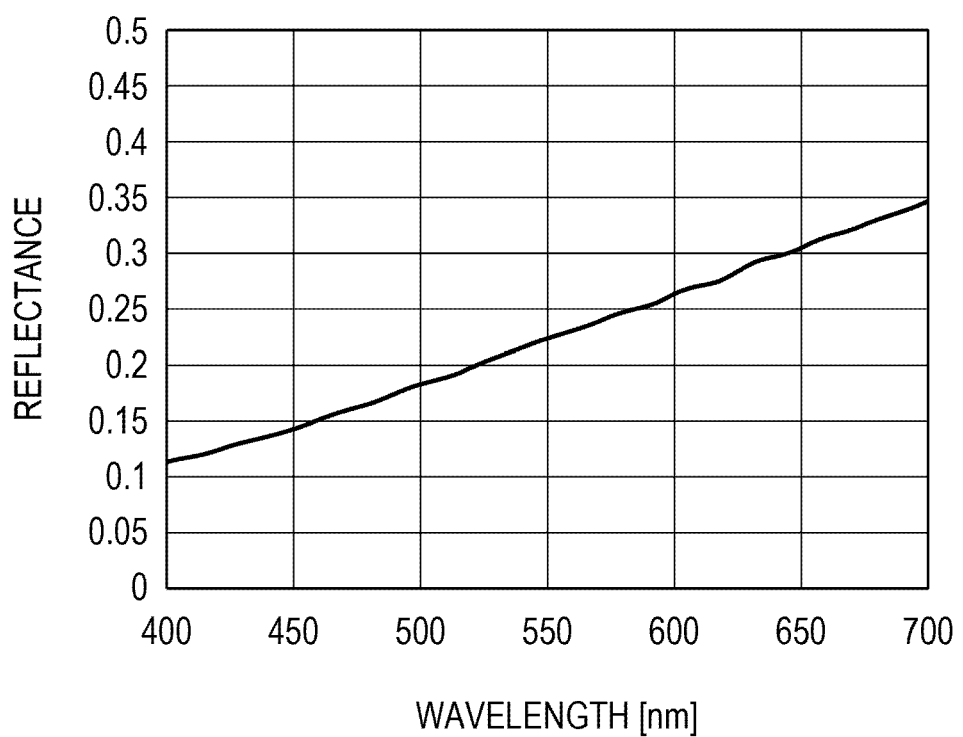
FIG. 2 is a view illustrating a wavelength dispersion of the reflectance of a metal thin film.

The reason why the current efficiency of the organic EL element which emits blue color becomes the biggest is as follows. When constituting the second electrode 15 at the light emission side with a metal thin film of Ag or the like of 5 nm or more and 30 nm or lower, the reflectance of the second electrode 15 is low in a short wavelength region as illustrated in FIG. 2. This is considered to be because the absorption in the metal thin film in a short wavelength region is high. When using a metal thin film as the second electrode 15 of each organic EL element, each organic EL element has a configuration of having a resonator structure, so that an improvement of the current efficiency is expected. In the resonator structure, multiple reflection is repeated in a resonant portion. Therefore, when a member having high absorption is present, an increase in absorption due to multiple reflection is large, so that the light emission efficiency does not improve. In general, since a metal thin film has high absorption at the short wavelength side, the resonance effect of the organic EL element which emits blue color becomes smaller than that of the organic EL elements which emit other colors, so that the light emission efficiency of the organic EL element which emits blue color is lower than that of the other elements which emit other colors. As a result, the power consumption of the organic EL element which emits blue color becomes higher than that of the other elements which emit other colors. The resonator structure intensifies a specific wavelength utilizing the multiple interference effect between the reflection plane on the first electrode 11 and the reflection plane on the second electrode 15. In the organic EL element having the resonator structure, the film thickness or the like of the organic compound layer is determined in such a manner that the optical distance L between the reflection plane on the first electrode 11 and the reflection plane on the second electrode 15 satisfies the following Equation 1.

$$L=(\lambda/2)\times(m+(\phi)/2\pi)$$  Equation 1

In Equation 1, $\lambda$ is the maximum peak wavelength of the spectrum of light beams emitted from the organic EL elements, m is an integer of 0 or more, and $\phi$ is the sum of the phase shifts when light beams emitted from the light emitting layers are reflected on the reflection plane on the first electrode 11 and the reflection plane on the second electrode 15.

Phosphorescent materials that can be practically used as a blue color light emitting material have not been sufficiently developed, and fluorescent materials are used as light emitting materials of the organic EL element which emits blue color in many cases. In contrast, red color and green color phosphorescent materials can be practically used. Mentioned as the red color phosphorescent material, $btp_2Ir(acac)$, $Ir(piq)_3$, and $Ir(tiq)_3$ represented by Chemical Formula 1. Mentioned as the green color phosphorescent material are $Ir(ppy)_3$ and $Ir(CH_3\text{-}ppy)_3$ represented by Chemical Formula 2. Therefore, when phosphorescent materials are used in the organic EL element which emits red color and the organic EL element which emits green color, a difference in the internal quantum efficiency of the organic EL element which emits blue color and the organic EL elements which emit other colors becomes large.

Chemical Formula 1

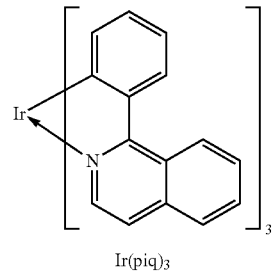

Ir(piq)₃

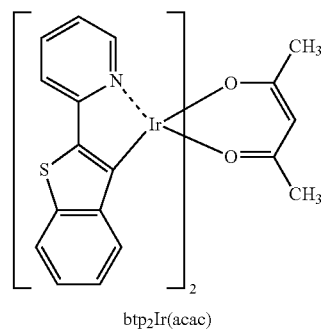

btp₂Ir(acac)

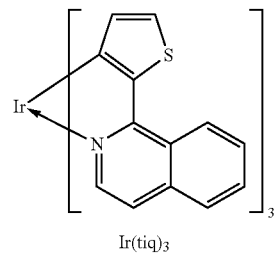

Ir(tiq)₃

Chemical Formula 2

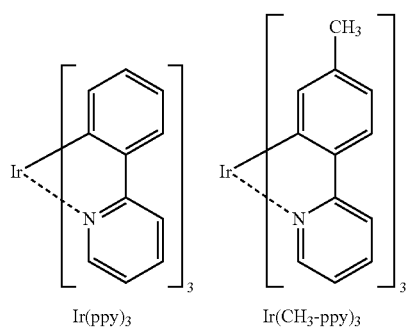

Ir(ppy)₃     Ir(CH₃-ppy)₃

After excited from the ground state to a singlet excited state, light emitted when returning to the ground state from the singlet excited state is referred to as fluorescent light. After transited from the singlet excited state to the triplet excited state, light emitted when returning to the ground state from the triplet excited state is referred to as phosphorescent light.

Even when the organic EL element does not have the resonator structure, light in a short wavelength (blue color) region is absorbed at least by the metal layer of the first electrode 11, so that the current efficiency of the organic EL element which emits blue color becomes lower than that of the organic EL elements which emit other colors. Therefore, it is suitable to provide the structure for improving light emission efficiency only at the light emission side of the organic EL element which emits blue color.

In a display apparatus having an organic EL element which emits fluorescent light and an organic EL element which emits phosphorescent light, it is also suitable to provide the structure for improving light emission efficiency only at the light emission side of an organic EL element which emits fluorescent light with a low internal quantum efficiency, i.e., with a low current efficiency, irrespective of the luminescent color. In the case of a display apparatus in which both the organic EL element which emits fluorescent light and the organic EL element which emits phosphorescent light are provided, most of the power consumption is used for driving the organic EL element which emits fluorescent light. Therefore, the power consumption of the display apparatus can be sharply reduced simply by reducing the power consumption of the organic EL element which emits fluorescent light.

When using a hemispherical lens as illustrated in FIG. 1B, it is suitable to specify the distance between the lens 30 and the light emitting position in such a manner that the light emitting position of the light emitting layer of the organic EL element is located at the focus of the lens 30. Moreover, it is more effective for an improvement of the current efficiency to reduce the light emitting region of the organic EL element to be smaller than the lens diameter of the lens 30. Therefore, it is desirable that the light emitting region of the organic EL element (organic EL element with the biggest power consumption) provided with the lens 30 is smaller than the light emitting region of the organic EL elements which emit other colors. When the light emitting region (opening ratio) of the organic EL element is made small, a current density required for emitting light increases. In the organic EL element which emits phosphorescent light, a roll-off phenomenon in which the light emission efficiency decreases with an increase in the current density is more noticeable than in the organic EL element which emits fluorescent light. Therefore, in order to prevent a reduction in the current efficiency even when the light emitting region small is made small, it is suitable that the organic EL element (organic EL element with the biggest power consumption) provided with the lens 30 is an organic EL element which emits fluorescent light.

The substrate 10 is an insulating substrate on which switching elements (not illustrated), such as TFT or MIM, are formed and contains glass, plastic, or the like. The substrate 10 may have an interlayer insulation film in which a contact hole for electrically connecting the switching element and the first electrode 11 is formed. Furthermore, the substrate 10 may have a planarization film for planarizing irregularities caused by the switching elements.

For the first electrode 11, a metal layer containing metal simple substances, such as Al, Cr, and Ag, or an alloy thereof can be used. A configuration can also be employed in which a transparent oxide conductive layer, such as a compound layer of indium oxide and tin oxide or a compound layer of indium oxide and zinc oxide, is laminated on the metal layer. The film thickness of the first electrode 11 is suitably 50 nm or more and 200 nm or lower. The "transparent" means having light transmittance of 40% or more in a visible light region (wavelength of 400 nm to 780 nm).

The reflection plane on the first electrode 11 is the interface of the metal layer and the organic compound layer when the first electrode 11 contains only the metal layer and the interface of the metal layer and the transparent oxide conductive layer when the first electrode 11 has a laminated structure of the metal layer and the transparent oxide conductive layer.

The hole transporting layer 12 contains a single layer or a plurality of layers of organic compounds having a hole injecting property and a hole transporting property. In contrast, the electron transporting layer 14 contains a single layer or a plurality of layers of organic compounds having an electron injecting property and an electron transporting property. As required, in order to suppress the movement of electrons from the light emitting layer to the anode side, an electron blocking layer can also be provided as the hole transporting layer 12. As the electron transporting layer 14, a hole blocking layer can also be provided. As the hole transporting layer 12 and the electron transporting layer 14, an exciton blocking layer for suppressing the diffusion of excitons generated in the light emitting layer can also be provided.

To the light emitting layer 13R which emits red color, the light emitting layer 13G which emits green color, and the light emitting layer 13B which emits blue color, known materials can be applied without particular limitation. For example, a single layer of a material having both a light emitting property and a carrier transporting property or a mixed layer of a light emitting material, such as a fluorescent material or a phosphorescent material, and a host material having a carrier transporting property can be applied.

For the light emitting layers 13R, 13G, and 13B, the hole transporting layer 12, and the electron transporting layer 14, known materials can be used. As film forming techniques, known film forming techniques, such as a vapor deposition method or a transfer method, can be used. The film thickness of each layer is desirably set to the optimal film thickness in order to increase the luminous efficiency of the organic EL elements of the respective colors and is desirably 5 nm or more and 100 nm or lower.

For the second electrode 15, a metal thin film containing a metal simple substance, such as Al, Cr, or Ag, or an alloy thereof can be used. Particularly, a metal thin film containing Ag has low absorptivity and low specific resistance, and thus is suitable as the second electrode 15. The film thickness of the second electrode 15 is suitably 5 nm or more and 30 nm or lower. The second electrode 15 may have a configuration in which the above-described metal thin film and the above-described transparent oxide conductive layer, such as a compound layer of indium oxide and tin oxide or a compound layer of indium oxide and zinc oxide, are laminated or may be constituted only by the transparent oxide conductive layer.

When the second electrode 15 has a metal layer, the reflection plane on the second electrode 15 is a plane at the side of the organic compound layer of the metal layer. When the second electrode 15 is constituted only by the transparent oxide conductive layer, an interface with a larger refractive-index difference among the interface of the transparent oxide conductive layer and the organic compound layer and the interface of the transparent oxide conductive layer and the protective layer 40 serves as a reflection plane on the second electrode 15.

For the protective layer 40, known materials and known film forming techniques can be used. As an example, a method including forming silicon nitride, oxynitride silicon, or silicon oxide into a film by a CVD apparatus is mentioned. The film thickness of the protective layer 40 is suitably 0.5 μm to 10 μm in order to have protection performance.

For the lens 30, thermosetting resin, thermoplastic resin, and photocuring resin with a low moisture content can be used. The film thickness of the lens 30 is suitably 10 μm to 100 μm. When thermosetting resin and photocuring resin are used, a spin coating method, a dispense method, and the like can be used as the film forming method. Moreover, a method including pasting a thermoplastic resin film having a film thickness of about 10 μm to about 100 μm onto the protective layer 40 under a vacuum can also be used. As specific resin materials, epoxy resin and butyl resin are suitably used.

Mentioned as methods for manufacturing the lens 30 are the following methods:
(1) a method including preparing a die of a lens, and then pressurizing the die against a resin layer to form the resin layer into a lens shape;
(2) a method including heat treating a resin layer patterned by photolithography or the like, and then transforming the resin layer into a lens shape by reflow;
(3) a method including exposing a photocuring resin layer formed with a uniform thickness with light having distribution in the in-plane direction, and developing the resin layer to form a lens;
(4) a method including processing the surface of a resin material formed with a uniform thickness using an ion beam, an electron beam, a laser beam, or the like into a lens shape;
(5) a method including adding dropwise an appropriate amount of resin to each pixel to thereby form a lens in a self aligning manner; and
(6) a method including preparing a resin sheet on which a lens is formed beforehand separately from a substrate on which organic EL elements are formed, aligning the substrate and the resin sheet, and then pasting them to each other to form a lens.
Any method may be acceptable insofar as a lens can be formed.

As materials of the lens 30, inorganic substances, such as silicon nitride or silicon oxide, may be used. In that case, a silicon nitride layer or a silicon oxide layer is first formed by a CVD method, and then a lens-shaped structure is formed with resin thereon. By dry etching them, the lens shape is transferred to the silicon nitride layer or the silicon oxide layer. The lens 30 may be formed by processing the surface of the protective layer 40 into the lens shape.

The lens 30 may have a convex shape or a concave shape insofar as the lens has a light gathering property. The "light gathering property" is a property in which the intensity in the front direction becomes higher as compared with the radiation property of light beams on a flat extraction surface without a lens. The light gathering property depends on the light emitting area of the organic EL element, the curvature of the lens, the distance from the light emitting surface to the lens, the refractive index of the material of the lens, and the like. The lens is suitably designed in such a manner as to achieve a desired light gathering property based on them as parameters.

Figure 3:
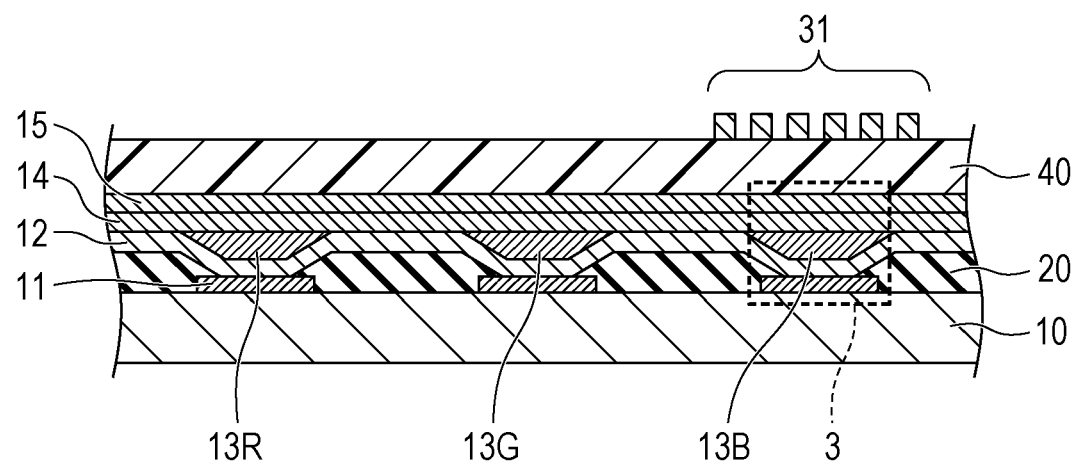
FIG. 3 is a cross-sectional schematic view illustrating another example of the display apparatus according to the invention.

As the structure for improving light emission efficiency provided only at the light emission side of the organic EL element with the biggest power consumption, a diffraction grating 31 as illustrated in FIG. 3 may be acceptable and known structures of fine particles, a prism sheet, or the like may be acceptable. The lens shape is not limited to the hemispherical shape, and an aspherical surface, such as a pyramid shape, may be acceptable.

When the lens 30 is provided as the structure for improving light emission efficiency, it is suitable that the area where the lens 30 is disposed is larger than the light emission area of the organic EL element. It is also suitable that the center of the light emission region of the organic EL element is disposed in the solid angle formed by connecting the focal point of the lens 30 and the end portions of the lens 30. It is also suitable that the center of the light emission region of the organic EL element is disposed on the optical axis of the lens 30.

This embodiment describes a top emission type display apparatus in which light is emitted from the side opposite to the substrate 10 but a bottom emission type display apparatus in which light is emitted from the substrate 10 side may be effective.

As the intended use of the display apparatus of the invention, the display apparatus of the invention is applied to a mobile requiring an improvement of visibility by increasing the luminance, and, for example, back monitors of digital cameras, displays for cellular phones, and the like are mentioned. Moreover, since a low power consumption is expected even in the case of the same luminosity, the display apparatus of the invention is useful for indoor use.

The invention can be variously applied and altered without being limited to the configuration described above unless deviating from the gist described above.

EXAMPLES

Example 1

As Example 1, a display apparatus provided with the hemisphere lens 30 only at the light emission side of the organic EL element which emits blue color with the biggest power consumption as illustrated in FIG. 1 was produced by a method described below.

First, a TFT drive circuit (not illustrated) containing low-temperature polysilicon was formed on a glass base material, a planarization film (not illustrated) containing acrylic resin was formed thereon to thereby form the transparent insulation substrate 10.

Next, laminated films containing an Ag alloy and indium oxide tin were individually formed as the first electrodes 11 (anode) by a sputtering method, and then patterned in accordance with the light emitting region of each pixel. Then, as the insulating layer 20, polyimide resin was spin coated, and then patterned by photolithography in such a manner as to form a light emitting region in accordance with the pixel. The insulating layer 20 was formed in such a manner that the light emitting region of the organic EL element which emits blue color was smaller than that of other colors.

Next, organic compound layers were successively formed into films by a vacuum evaporation method. In each luminescent color, the hole transporting layer 12 was formed in such a manner that the film thickness thereof varies in each luminescent color, so that the optical distance between the reflection plane on the first electrode 11 and the reflection plane on the second electrode 15 formed later satisfies Equation 1. As a light emitting material included in the light emitting layer 13B of the organic EL element which emits blue color, a fluorescent material is included. As light emitting materials included in the light emitting layers 13G and 13R of the organic EL elements which emit green color and red color, phosphorescent materials were used. The electron transporting layer 14 was formed with the same film thickness with a common material in the respective luminescent colors.

Next, as the second electrode 15, an Ag alloy was formed into a film over the organic EL element of the respective luminescent colors by a vacuum evaporation method. Thereafter, a silicon nitride layer was formed into a film by a CVD method as the protective layer 40.

Next, a photosensitive resist was spin coated onto the silicon nitride layer, and exposure and development were performed using a photomask. The photomask had an opening for exposing only the upper portion of the organic EL element which emits blue color. Thereafter, post-baking was performed, and then reflow of the resist form was carried out. By dry etching the silicon nitride layer with the resist pattern, the hemisphere lens 30 was processed to be formed on the surface of the protective layer 40 and only at the light emission side of the organic EL element 3 which emits blue color.

Furthermore, after forming the hemisphere lens 30, the organic EL element was sealed with a sealing glass (not illustrated), and then a circularly polarizing plate (not illustrated) was pasted onto the sealing glass.

Comparative Example 1

Comparative Example 1 is different from Example 1 in that the lens 30 is not provided, and the other configurations were the same as those of Example 1.

Comparative Example 2

Comparative Example 2 is different from Example 1 in that the lens 30 is provided also at the light emission sides of the organic EL elements which emit red color and green color, and the other configurations were the same as those of Example 1.

Comparative Example 3

Comparative Example 3 is different from Example 1 in that the lens 30 is provided not at the light emission side of the organic EL element which emits blue color but only at the light emission side of the organic EL element which emits red color, and the other configurations were the same as those of Example 1.

Comparative Example 4

Comparative Example 4 is different from Example 1 in that the lens 30 is provided not at the light emission side of the organic EL element which emits blue color but only at the light emission side of the organic EL element which emits green color, and the other configurations were the same as those of Example 1.

<Evaluation of Display Devices>

The relative values of the power consumption and the external light reflection (SCE) measured values of Example 1 and Comparative Examples 1 to 4 were shown together in Table 1. For the measurement of the external light reflection (SCE), a SPECTROPHOTOMETER CM-2600d manufactured by Konica Minolta was used. The SCE is an index for mainly measuring the reflectance of diffused and scattered light while removing regularly reflected light. In the display apparatus, the SCE value is suitably 0.5% or lower. The power consumption is represented as a relative value when the power consumption of Comparative Example 1 was set to 1.00.

Table 1 showed that the power consumption of Example 1 was 70% or lower relative to Comparative Example 1 and the SCE was lower than that of Comparative Example 2 and the SCE value was smaller than 0.5%. In Example 1, the power consumption was lower than that of Comparative Examples 3 and 4.

TABLE 1

|  | Ex. 1 | Comp. Ex. 1 | Comp. Ex. 2 | Comp. Ex. 3 | Comp. Ex. 4 |
| --- | --- | --- | --- | --- | --- |
| Power consumption | 0.69 | 1.00 | 0.40 | 0.87 | 0.84 |
| SCE | 0.46% | 0.34% | 0.78% | 0.46% | 0.46% |

Example 2

Example 2 is different from Example 1 in the following points. More specifically, Example 2 is different from Example 1 in that the light emitting material included in the green color light emitting layer 13G is a fluorescent material, the light emitting regions of all of the organic EL elements have the same size, and not the lens 30 but the diffraction grating 31 was provided.

Example 2 is a display apparatus having a configuration illustrated in FIG. 3. In Example 2, the display apparatus was formed by a manufacturing method including the same processes as those of Example 1 until the protective layer 40 was formed.

Next, a resin material was spin coated onto the protective layer 40, and thereafter a pattern of a diffraction grating was formed by applying a nanoimprint method only at the light emission side of the organic EL element which emits blue color.

Comparative Example 5

Comparative Example 5 is different from Example 2 in that the diffraction grating 31 was not provided, and the other configurations were the same as those of Example 2.

Comparative Example 6

Comparative Example 6 is different from Example 2 in that the diffraction grating 31 was provided also at the light emission sides of the organic EL elements which emit red color and green color, and the other configurations were the same as those of Example 2.

Comparative Example 7

Comparative Example 7 is different from Example 2 in that the diffraction grating 31 was provided not at the light emission side of the organic EL element which emits blue color but only at the light emission side of the organic EL element which emits red color, and the other configurations were the same as those of Example 2.

Comparative Example 8

Comparative Example 8 is different from Example 2 in that the diffraction grating 31 was provided not at the light emission side of the organic EL element which emits blue color but only at the light emission side of the organic EL element which emits green color, and the other configurations were the same as those of Example 2.

<Evaluation of Display Devices>

The relative values of the power consumption and the external light reflection (SCE) measured values of Example 2 and Comparative Examples 5 to 8 were shown together in Table 2. The power consumption is represented as a relative value when the power consumption of Comparative Example 5 was set to 1.00.

Table 2 showed that the power consumption of Example 2 was 70% or lower relative to Comparative Example 5 and the SCE was lower than that of Comparative Example 6 and the SCE value was smaller than 0.5%. In Example 2, the power consumption was lower than that of Comparative Examples 7 and 8.

TABLE 2

|  | Ex. 2 | Comp. Ex. 5 | Comp. Ex. 6 | Comp. Ex. 7 | Comp. Ex. 8 |
| --- | --- | --- | --- | --- | --- |
| Power consumption | 0.70 | 1.00 | 0.56 | 0.88 | 0.86 |
| SCE | 0.49% | 0.34% | 0.88% | 0.49% | 0.49% |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-127679 filed Jun. 7, 2011 and No. 2012-094072 filed Apr. 17, 2012, which are hereby incorporated by reference herein in their entirety.

What is claimed is:

1. A display apparatus, comprising:
    an organic EL element which emits red color, an organic EL element which emits green color, and an organic EL element which emits blue color,
    a structure for improving light emission efficiency being provided only at a light emission side of the organic EL element which emits blue color.

2. The display apparatus according to claim 1, wherein a light emitting region of the organic EL element which emits blue color is smaller than light emitting regions of the organic EL element which emits red color and the organic EL element which emits green color.

3. The display apparatus according to claim 2, wherein the organic EL element which emits blue color emits fluorescent light.

4. The display apparatus according to claim 3, wherein the organic EL element which emits red color and the organic EL element which emits green color emit phosphorescent light.

5. The display apparatus according to claim 1, wherein the organic EL elements have a resonator structure.

6. The display apparatus according to claim 1, wherein the structure for improving light emission efficiency is a lens.

7. The display apparatus according to claim 6, wherein the area where the lens is disposed is larger than the light emission area of the organic EL elements.

8. The display apparatus according to claim 6, wherein the center of the light emission region of the organic EL element is disposed in the solid angle formed by connecting the focal point of the lens and the end portions of the lens.

9. The display apparatus according to claim 6, wherein the center of the light emission region of the organic EL element is disposed on the optical axis of the lens.

10. A display apparatus, comprising:
    an organic EL element which emits fluorescent light and an organic EL element which emits phosphorescent light,
    a structure for improving light emission efficiency being provided only at a light emission side of the organic EL element which emits fluorescent light.

11. The display apparatus according to claim 10, wherein a light emitting region of the organic EL element which emits fluorescent light is smaller than light emitting regions of the organic EL element which emits phosphorescent light.

12. The display apparatus according to claim 10, wherein the organic EL elements have a resonator structure.

* * * * *